United States Patent [19]
Szmurlo et al.

[11] Patent Number: 5,838,195
[45] Date of Patent: Nov. 17, 1998

[54] REDUCTION OF SECOND ORDER HARMONIC DISTORTION IN HIGH POWER TWT AMPLIFIERS

[75] Inventors: Thomas E. Szmurlo; Mitchell F. Radich, both of Palatine; Warren E. Guthrie, Glen Ellyn, all of Ill.

[73] Assignee: Northrop Grumman Corporation, Los Angeles, Calif.

[21] Appl. No.: 693,384

[22] Filed: Aug. 6, 1996

[51] Int. Cl.⁶ .................................. H03F 1/26; H03F 3/58
[52] U.S. Cl. .............................................. 330/149; 330/43
[58] Field of Search ................................ 330/43, 53, 149, 330/303; 327/553

[56] References Cited

U.S. PATENT DOCUMENTS

| | | | |
|---|---|---|---|
| 4,207,543 | 6/1980 | Izakson et al. | 333/17 R |
| 4,291,277 | 9/1981 | Davis et al. | 330/149 |
| 4,329,655 | 5/1982 | Nojima et al. | 330/149 |
| 4,531,098 | 7/1985 | Reed | 330/53 |
| 4,560,945 | 12/1985 | Olver | 330/149 |
| 4,673,886 | 6/1987 | Bickley et al. | 330/298 |
| 4,701,717 | 10/1987 | Radermacher et al. | 330/149 |
| 4,752,743 | 6/1988 | Pham et al. | 330/149 |
| 4,878,030 | 10/1989 | Vincze | 330/149 |
| 4,967,164 | 10/1990 | Sari | 330/149 |
| 5,093,629 | 3/1992 | Toyoshima et al. | 330/149 |
| 5,172,068 | 12/1992 | Childs | 328/162 |
| 5,172,072 | 12/1992 | Willems et al. | 330/149 |
| 5,291,148 | 3/1994 | Reisner et al. | 330/149 |
| 5,402,085 | 3/1995 | Cote | 330/149 |

*Primary Examiner*—Steven Mottola
*Attorney, Agent, or Firm*—Terry J. Anderson; Karl J. Hoch, Jr.

[57] ABSTRACT

Second harmonic distortion of a traveling wave tube amplifier with a bandwidth exceeding one octave is efficiently minimized by generating a low-power second harmonic signal, modifying it by an adaptive filter, and adding the modified second harmonic signal to the fundamental frequency input signal to the TWT. The adaptive filter is controlled by a feedback loop from the output of the TWT and is arranged to minimize the correlation between the generated second harmonic signal and the second harmonic content of the TWT output. Intermodulation distortion is eliminated in a similar manner.

6 Claims, 5 Drawing Sheets

REDUCTION OF SECOND ORDER HARMONIC DISTORTION IN HIGH POWER TWT AMPLIFIERS

FIELD OF THE INVENTION

This invention relates to high power traveling wave tube amplifiers, and more specifically to a method and apparatus for suppressing second harmonic distortion by applying an amplitude-regulated low-power out-of-phase second harmonic signal to the input of the amplifier.

BACKGROUND OF THE INVENTION

Traveling wave tube (TWT) amplifiers for high power applications such as electronic countermeasures are well known. It is also well known that TWTs are non-linear amplifying devices, i.e. the modification of amplitude and phase which the TWT performs on the input signal varies with frequency. Consequently, undesirable spurious signals are produced by the TWT. Some of these could lie within the bandwidth of the device using the TWT. In addition, TWT amplifiers also exhibit AM-AM and AM-PM conversion characteristics which further modify the desired signals.

The behavior of the TWT amplifier can be approximated by the Fourier series $V_{out} = A_0 + A_1 * V_{in} + A_2 * V_{in}^2 + A_3 * V_{in}^3 + \ldots$ where the coefficients $A_x$ are complex quantities that are functions of frequency and the amplitude of $V_{in}$. If $V_{in}$ consists of a single sinusoidal input, $B \sin \omega_1 t$, then $V_{out}$ consists of a DC term, the amplified fundamental at $\omega_1$, and harmonics at $2\omega_1$, $3\omega_1$, etc. For broadband devices of one octave or more, at least the second harmonic will be present in the output.

A representative state-of-the-art TWT may yield high power (e.g. 1000 W continuous wave) with an operating frequency range of about 8 to 18 GHz. Inasmuch as this bandwidth is greater than 1 octave, a second harmonic will be generated by the TWT for each input signal between 8 and 9 GHz.

If the TWT amplified an input signal between 8 and 9 GHz, the tube output power is shared between the amplified fundamental and the TWT-generated second harmonic. At or near TWT saturation, the second harmonic can be as much as 3 dB below the fundamental. This implies that the fundamental can be amplified to a maximum of 666 watts with a second harmonic of 333 watts. Consequently, with an input signal between 8 and 9 Ghz, a second harmonic between 16 and 18 Ghz will be generated by the TWT with as much as 333 Watts of power. Electronic countermeasures equipment uses high power TWT's to jam hostile radars. The production of a second harmonic in the TWT reduces the power to the fundamental, as the amplifier is limited in the amount of total power it can deliver. This reduces jamming-to-signal margin which is critical in rendering the hostile radar ineffective. A high power second harmonic can also give away the characteristics of the electronic countermeasures set, which can be used to its disadvantage by hostile forces.

Cancellation of this undesirable second harmonic can be performed at the tube output or input. If cancelled at the tube output, the second harmonic would have to be matched in amplitude and 180 degrees out of phase. Matching the harmonic in amplitude implies using a matching amplifier that can produce up to 333 Watts of signal power. This is undesirable since a second high power device would be required, thereby adding to system cost, complexity, and power requirements.

Rather than cancelling the second harmonic term at the tube output, it is possible to inject a second harmonic into the tube with the right magnitude and phase such that the two second harmonics cancel each other within the tube. Cancelling at the input would require a preamp capable of handling less than 200 milliwatts of power. Therefore, it is clearly desirable to cancel the second harmonic at the TWT input rather than at its output.

Several ways of counteracting the nonlinearity problem have been proposed in the past. For example, a predistortion circuit may be used. Such a circuit usually consists of a nonlinear device designed to produce nonlinear terms that cancel out the nonlinear terms of the amplifier when applied to the input of the amplifier.

These circuits are effective for frequency bands of less than 500 MHz, and are usually designed to remove close-in intermodulation products in tight channel spacing applications. They are not, however, suitable for the wide-band applications in which the harmonic problem arises.

A wider band solution removes the fundamental from the output of the main amplifier, leaving a representation of the nonlinear terms. The nonlinear terms so obtained are phase-inverted in an error amplifier and summed with the main amplifier output to cancel the nonlinear terms in the output. The principal drawback of this architecture is that the cancellation is performed on the output side of the amplifier, so that the error amplifier must match the signal strength of the nonlinear term output signal. In the case of the above-mentioned TWT, this would mean that the error amplifier would need to provide 333 W of power, which of course is undesirable.

Consequently, although the prior art solutions have proven generally suitable for their intended purposes, they possess inherent deficiencies which detract from their overall effectiveness and desirability. It is thus desirable to provide a broadband way of cancelling harmonics by applying to the input of a TWT a low power cancellation signal coordinated with the TWT's output.

SUMMARY OF THE INVENTION

The present invention specifically addresses and alleviates the above-mentioned deficiencies associated with the prior art. More particularly, the present invention provides an adaptive filter which generates a low-power second harmonic signal, and so modifies its phase and amplitude that, when it is injected into the TWT, it cancels out the TWT-generated second harmonic. The modification is continuously adjusted by a feedback circuit which fine-tunes the parameters of the filter to minimize the second harmonic in the output of the TWT.

The advantages of the inventive adaptive filter canceller are as follows: 1) it requires little power because the cancellation is performed by harmonic injection; 2) it is self-adjusting to minimize the harmonic signal regardless of the input frequency and power level of the fundamental; 3) it can be designed to have a very wide bandwidth in the microwave frequency range; and 4) it automatically compensates for the changes in the nonlinear characteristics of the TWT that occur with age, temperature changes, and changes in the bias voltage.

These, as well as other advantages of the present invention will be more apparent from the following description and drawings. It is understood that changes in the specific structure shown and described may be made within the scope of the claims without departing from the spirit of the invention.

DESCRIPTION OF THE PREFERRED EMBODIMENT

The detailed description set forth below in connection with the appended drawings is intended as a description of the presently preferred embodiment of the invention, and is not intended to represent the only form in which the present invention may be constructed or utilized. The description sets forth the functions and the sequence of steps for construction and operating the invention in connection with the illustrated embodiment. It is to be understood, however, that the same or equivalent functions and sequences may be accomplished by different embodiments that are also intended to be encompassed within the spirit and scope of the invention.

Figure 1:
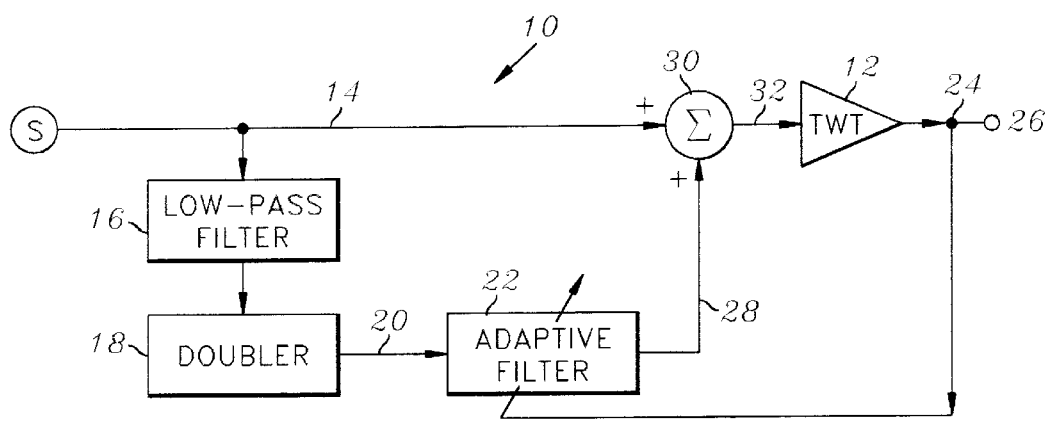
FIG. 1 is a block diagram of the inventive circuit.

The basic circuit 10 for carrying out the invention is shown in FIG. 1. In that figure, the TWT is seen at 12. Its principal input is a substantially sinusoidal signal S on line 14 whose frequency can be anywhere within, say, an 8–18 GHz band. If the frequency of the input signal S is greater than 9 GHz, its second harmonic frequency will be greater than 18 GHz and therefore out of the frequency band of the TWT 12. Consequently, second harmonic generation is a problem only for input frequencies of 9 GHz or less.

Input signals of these frequencies are tapped off line 14 and applied through low-pass filter 16 to a frequency doubler 18 which puts out on line 20 a second harmonic of the input signal S. The second harmonic signal on line 20 is applied to an adaptive filter 22 whose parameters are controlled by a portion of the signal tapped off at 24 from the output 26 of the TWT 12. The output of the adaptive filter 22 on line 28 is added in adder 30 to the signal S on line 14, and the summed output of adder 30 is applied to the input of TWT 12 on line 32.

Figure 2:
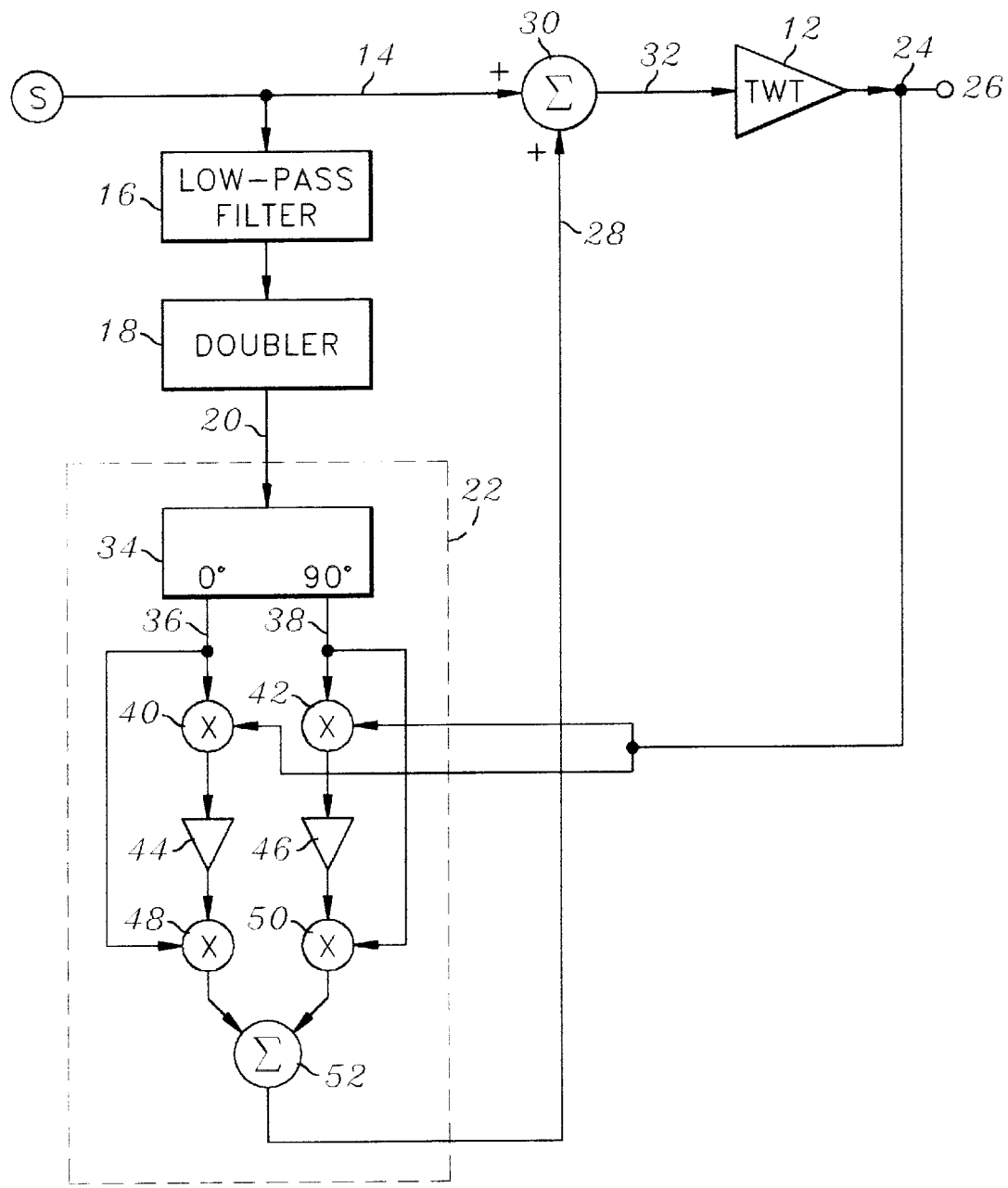
FIG. 2 is a more detailed block diagram illustrating the adaptive filter circuitry of the preferred embodiment.

The details of the adaptive filter 22 of this invention are shown in FIG. 2. In that figure, the second harmonic on line 20 of the signal S is applied to a quadrature power divider 34 which produces an in-phase output 36 and a quadrature output 38. The outputs 36, 38 are applied, respectively, to multipliers 40, 42 where they are multiplied by the output signal 26 of the TWT 12 tapped off at 24. The results of the multiplications are integrated by integrators 44, 46. The multipliers 40, 42 and integrators 44, 46 form correlators. If the inputs of the respective multipliers 40, 42 are of the same frequency and in phase, the correlation is high.

The outputs of integrators 44, 46 are applied to one of the inputs of multipliers 48, 50, respectively, while the in-phase signal 36 and the quadrature signal 38 are applied to the other input of multipliers 48, 50, respectively. The outputs of multipliers 48, 50 are summed in adder 52 and become the output 28 of adaptive filter 22.

Because the integrators 44, 46 are inverting, each of the in-phase path 36, 40, 44, 48 and quadrature path 38, 42, 46, 50 will attempt to minimize any correlation, thereby minimizing the second harmonic output of the TWT 12. The combination of the outputs of multipliers 48 and 50 by the adder 52 forms a vector modulator which is able to synthesize the phase and amplitude of the harmonic required to cancel out the TWT-generated harmonic.

At microwave frequencies, the multipliers 40, 42, 48 and 50 are implemented using broadband double balanced mixers with DC coupled IF ports. Improved cancellation will result with well-balanced, low DC offset mixers.

For the multipliers or mixers 40 and 42 to effectively detect the correlation of the signal on lines 36 and 38 with the signal on line 24, the signals being compared by mixers 40 and 42 must be in a phase at the comparison frequency or frequencies of interest. For example, in order to achieve a zero phase difference between the inputs to mixer 40, the signal traveling directly from phase splitter 34 to mixer 40 along line 36 must have the same insertion phase as the signal traveling along the much longer path through mixer 48, adder 52, line 28, adder 30, line 32, TWT 12 and line 24. To equalize the path lengths of the two signals, delay lines 51 and 53 of appropriate lengths are inserted in lines 36 and 38, respectively (FIG. 3).

Figure 3:
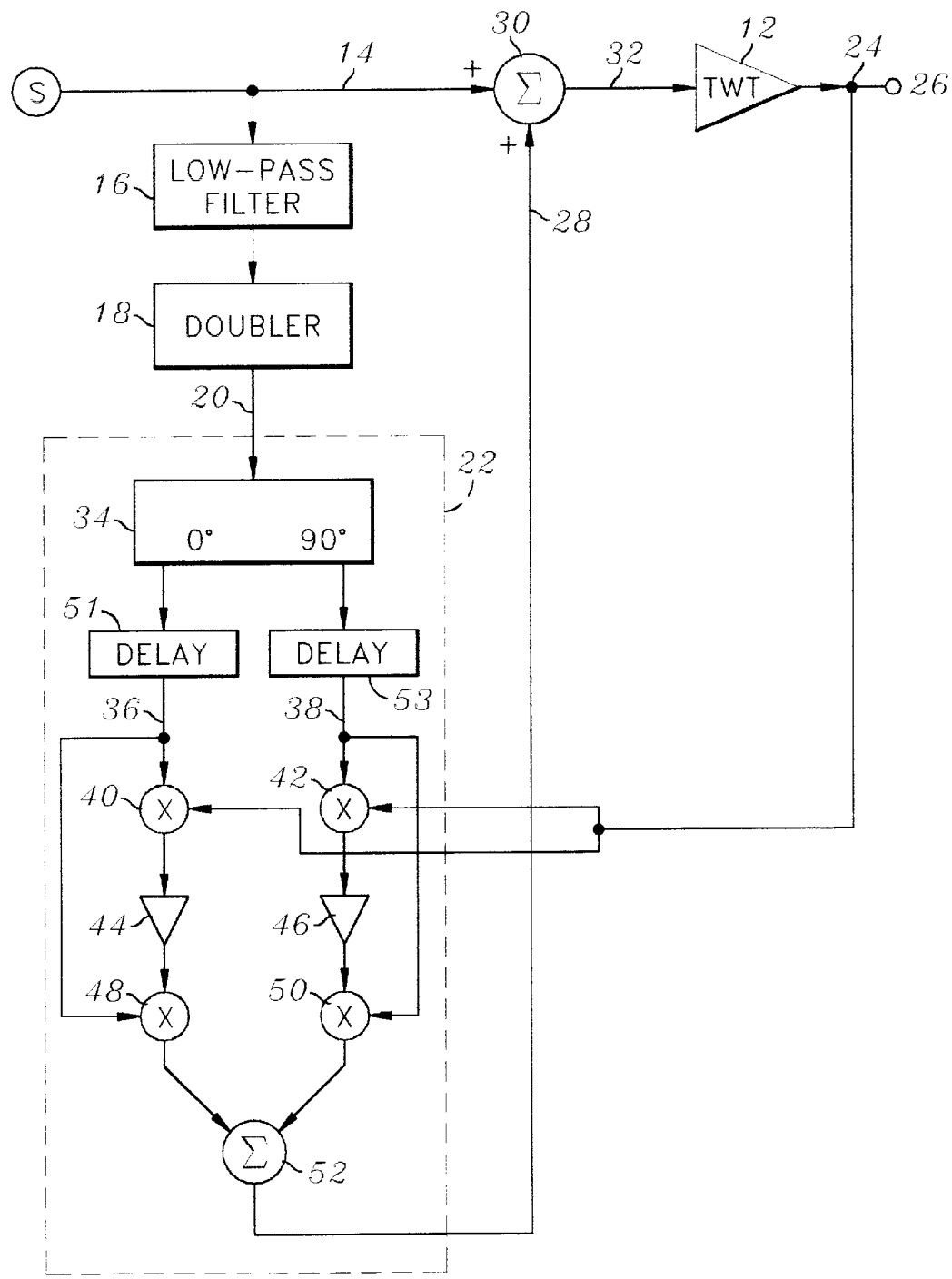
FIG. 3 is a block diagram similar to FIG. 2 but adding a path equalization feature.

The configuration of FIG. 3 requires two separate delay lines 51 and 53. This is undesirable because obtaining matching delays in both line 36 and line 38 is a complex task. Consequently, it is preferable to provide a single delay line 51 and a second 90° hybrid or quadrature power divider phase splitter 55 in the configuration of FIG. 4, which is the electrical equivalent of the configuration of FIG. 3. In practice, the above-described equalization of the path lengths has allowed a demonstrated broadband cancellation over 1 GHz of bandwidth.

Figure 4:
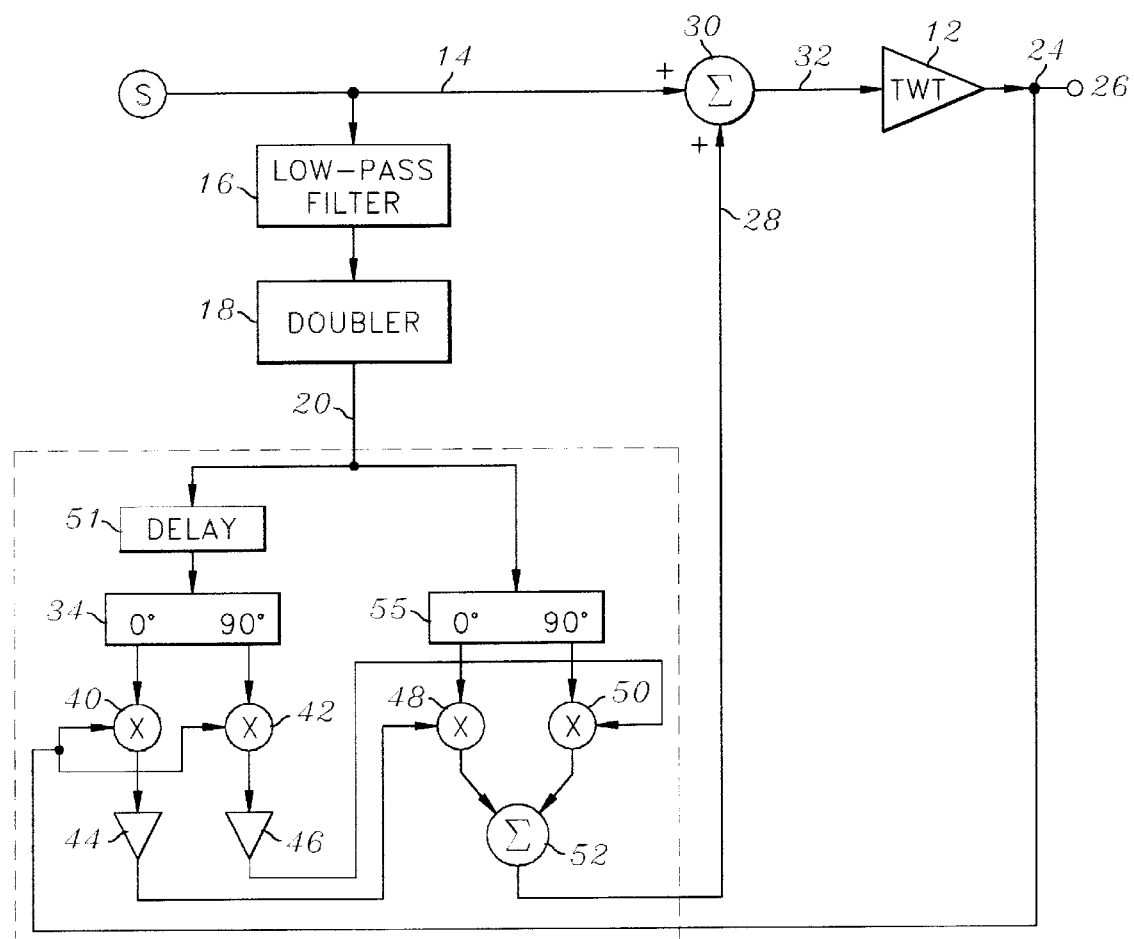
FIG. 4 is a block diagram similar to FIG. 3 but showing an alternative path equalization method.
Figure 5:
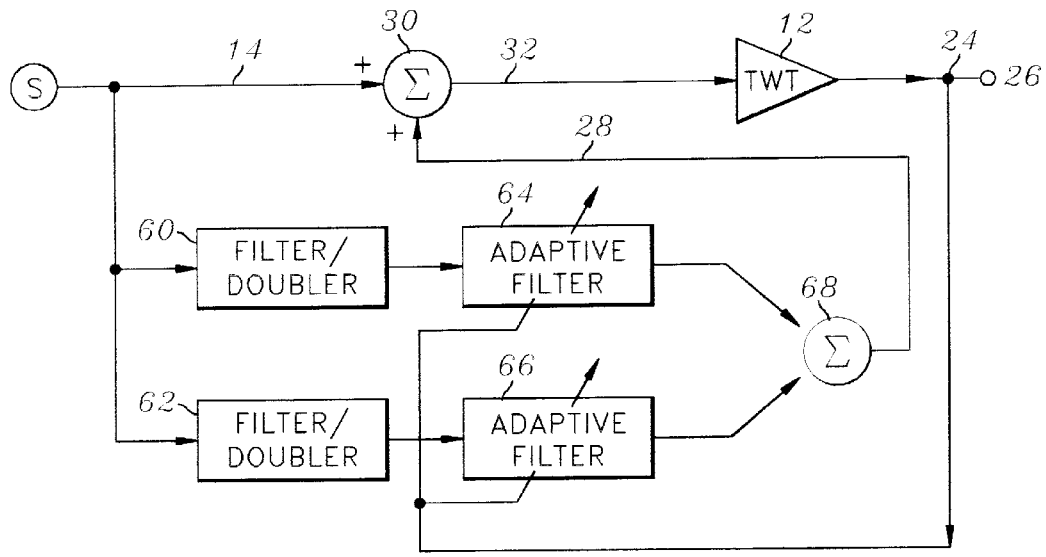
FIG. 5 is a block diagram of a multi-frequency embodiment of the inventive circuit.

FIG. 5 illustrates the expansion of the concept of FIG. 1 to more complex distortion problems. For example, in FIG. 5, the signal S is assumed to contain two frequencies $f_1$, $f_2$ which can cause second-harmonic distortion. Filter-doublers 60, 62 produce second harmonics $2f_1$, $2f_2$, respectively, and apply these to adaptive filters 64, 66, respectively, each of which functions as described above in connection with FIGS. 2–4, with their outputs combined in adder 68.

By training an adaptive filter on each of the high power second harmonic distortion terms expected, a very clean TWT output can be achieved, thus allowing highly efficient system operation in a hostile environment at relatively low cost.

Figure 6:
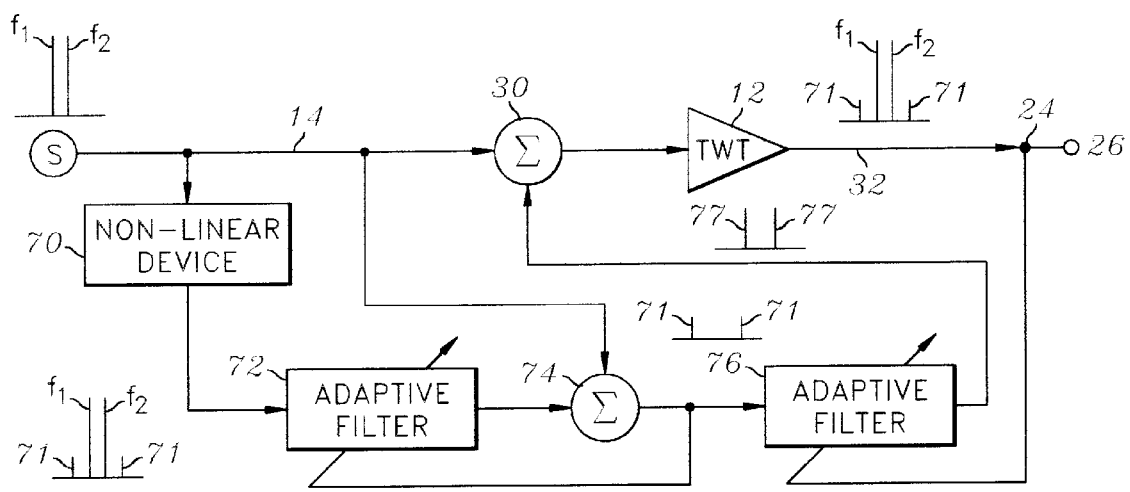
FIG. 6 is a block diagram of the inventive circuit modified to handle intermodulation distortion.

Intermodulation distortion can be handled in a similar manner. For example, in FIG. 6 signal S is again assumed to contain two fundamental frequencies $f_1$ and $f_2$. Both are passed through a non-linear device 70 which causes third-order distortion products 71 to be produced along with $f_1$ and $f_2$. Adaptive filter 72 is used to cancel out $f_1$ and $f_2$ to leave only the distortion products at the output of adder 74. The distortion products are then amplitude and phase adjusted by adaptive filter 76 so that when the adjusted distortion products 77 are added to the input of the TWT 12 by adder 30, the third-order distortion terms are cancelled or reduced within the TWT, leaving an essentially clean output signal as shown. Adaptive filter 76 should have a longer time constant than adaptive filter 72.

It should be understood that the adaptive filter implementation of FIGS. 2–4 is just one of many possible realizations. Other embodiments of adaptive filters known to persons skilled in the art of adaptive techniques may equally well be used. Consequently, those and other modifications and additions may be implemented by those skilled in the art to adapt the present invention for use in a variety of different applications.

We claim:

1. A method of minimizing harmonic distortion in a nonlinear amplifier having a bandwidth greater than one octave, comprising the steps of:
   a) generating a harmonic signal which is a harmonic of a fundamental frequency signal to be amplified;
   b) applying said harmonic signal to an adaptive filter;
   c) deriving from the output of said amplifier a signal representative of said output;
   d) so applying said representative signal to said adaptive filter as to cause said filter to modify said harmonic signal to produce a modified harmonic signal; and
   e) adding said modified harmonic signal to said fundamental frequency signal;
   f) said harmonic signal being so modified by applying said representative signal to said adaptive filter that the amplitude of said harmonic in said amplifier output is minimized; and
   g) said modification being accomplished by:
      i) splitting said harmonic signal into first and second signal portions in quadrature with each other;
      ii) multiplying each of said portions by said representative signal;
      iii) integrating and inverting each of said multiplied portions to form first and second integrated and inverted portions;
      iv) multiplying said first integrated and inverted portion by said first portion, and said second integrated and inverted portion by said second portion; and
      v) summing said so multiplied portions to form said modified harmonic signal.

2. A harmonic suppression system for nonlinear amplifiers, comprising:
   a) a nonlinear amplifier having an input and an output;
   b) a source of fundamental frequency signals to be amplified;
   c) a frequency doubler arranged to produce a signal which is a harmonic of said fundamental frequency;
   d) an adaptive filter having inputs connected, respectively, to said frequency doubler and to the output of said amplifier, said adaptive filter having inputs connected, respectively, to said frequency doubler and to the output of said amplifier, said adaptive filter being arranged to produce at its output an adaptively filtered harmonic signal; and
   e) an adder connected to sum said fundamental frequency signals and said adaptively filtered harmonic signal, and to apply said summed signals to the input of said amplifier;
   f) said adaptive filter being arranged to so adaptively filter said harmonic signal in response to the output of said amplifier that the amplitude of said harmonic in the output of said amplifier is continuously minimized;
   g) said adaptive filter being so constructed as to minimize the correlation between said harmonic signal and said harmonic in the output of said amplifier; and
   h) said adaptive filter including:
      i) a quadrature power divider connected to split said harmonic signal into first and second signals in quadrature with each other;
      ii) first multipliers having inputs and outputs connected so as to multiply each of said first and second signals by a signal representative of the output of said amplifier;
      iii) integrators having inputs and outputs connected so as to integrate and invert the respective signals resulting from said first multiplications;
      iv) second multipliers having inputs and outputs connected so as to multiply said resulting signals by said first and second signals, respectively; and
      v) an adder connected to sum said thus multiplied signals, the output of said adder being the output of said adaptive filter.

3. The system of claim 2, further comprising delay lines at the inputs to said first multipliers arranged to equalize the phase of said first signal with the phase of said output-representative signal.

4. The system of claim 2, in which said adaptive filter includes:
   i) a delay line for delaying a first portion of said harmonic signal;
   ii) a first quadrature power divider connected to split said delayed first portion of said harmonic signal into first and second signals in quadrature with each other;
   iii) first multipliers having inputs and outputs connected so as to multiply each of said first and second signals by a signal representative of the output of said amplifier;
   iv) integrators having inputs and outputs connected so as to integrate and invert the respective signals resulting from said first multiplications;
   v) a second quadrature power divider connected to split a second portion of said harmonic signal into third and fourth signals in quadrature with each other,
   vi) second multipliers having inputs and outputs connected so as to multiply said resulting signals by said third and fourth signals, respectively; and
   vii) an adder connected to sum said thus multiplied signals, the output of said adder being the output of said adaptive filter;
   viii) the delay produced by said delay line being such as to equalize the phase of said first signal with the phase of said output-representative signal.

5. The system of claim 1, in which:
   i) said source of fundamental frequency signals generates signals having a plurality of fundamental frequencies;
   ii) separate frequency doublers and adaptive filters connected to said source of fundamental frequency signals are provided for each of said fundamental frequencies;
   iii) each said adaptive filter produces at its output an adaptively filtered harmonic signal minimizing, in the output of said amplifier, the amplitude of the harmonic frequency associated with it; and
   iv) the outputs of all of said adaptive filters are summed with said signals generated by said source.

6. An intermodulation distortion suppression system for nonlinear amplifiers, comprising:
   a) a nonlinear amplifier having an input and an output;
   b) a signal source, said signal source providing a source signal containing at least a pair of fundamental frequencies to be amplified;
   c) a nonlinear device connected to said source to produce a distorted signal containing said fundamental frequencies plus intermodulation frequencies;
   d) a first adaptive filter connected to said nonlinear device to produce a cancellation signal in which said fundamental frequency components of said source signal are inverted;

e) a first adder connected to said signal source and said first adaptive filter to produce an intermodulation signal containing only said intermodulation frequencies, said first adaptive filter being also connected to the output of said first adder;

f) a second adaptive filter connected to the output of said first adder and to the output of said nonlinear amplifier to produce a modified intermodulation signal containing substantially an inverted representation of the intermodulation distortion produced by said nonlinear amplifier; and g) a second adder arranged to sum said source signal and the output of said second adaptive filter, the input of said nonlinear amplifier being connected to the output of said second adder.

* * * * *